(12) United States Patent
Arsovski

(10) Patent No.: US 7,735,046 B2
(45) Date of Patent: Jun. 8, 2010

(54) E-FUSE AND METHOD

(75) Inventor: Igor Arsovski, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 295 days.

(21) Appl. No.: 11/862,523

(22) Filed: Sep. 27, 2007

(65) Prior Publication Data

US 2008/0251852 A1   Oct. 16, 2008

Related U.S. Application Data

(63) Continuation-in-part of application No. 11/735,652, filed on Apr. 16, 2007, now abandoned.

(51) Int. Cl.
   *G06F 17/50*   (2006.01)
   *G06F 7/38*   (2006.01)
   *H01L 25/00*   (2006.01)
   *H03K 19/173*   (2006.01)

(52) U.S. Cl. .................. 716/17; 716/9; 716/10; 326/41; 326/44; 326/47; 326/49; 326/102; 257/209; 257/529

(58) Field of Classification Search ............. 716/9, 716/10, 17; 326/41, 44, 47, 49, 102; 257/209, 257/529

See application file for complete search history.

(56) References Cited

U.S. PATENT DOCUMENTS

| 4,907,180 | A | * | 3/1990 | Smith ..................... 703/14 |
| 5,341,382 | A | * | 8/1994 | Levitt ..................... 714/724 |
| 5,956,269 | A | | 9/1999 | Ouyang et al. |
| 6,532,579 | B2 | * | 3/2003 | Sato et al. ............... 716/8 |
| 6,983,428 | B2 | * | 1/2006 | Cernea ..................... 716/1 |
| 7,301,797 | B2 | | 11/2007 | Kimura |
| 7,313,021 | B2 | | 12/2007 | Horiuchi |
| 7,595,527 | B2 | * | 9/2009 | Bertin et al. ............ 257/316 |
| 2005/0091630 | A1 | * | 4/2005 | Madurawe ............... 716/16 |
| 2008/0212361 | A1 | * | 9/2008 | Bertin et al. ............ 365/151 |
| 2009/0184389 | A1 | * | 7/2009 | Bertin et al. ............ 257/476 |

FOREIGN PATENT DOCUMENTS

| JP | 05081883 A | * | 4/1993 |
| JP | 11317085 A | * | 11/1999 |

* cited by examiner

*Primary Examiner*—Phallaka Kik
(74) *Attorney, Agent, or Firm*—Schmeiser, Olsen & Watts; Riyon W. Harding

(57) ABSTRACT

An e-fuse circuit, a method of programming the e-fuse circuit, and a design structure of the e-fuse circuit. The method includes in changing the threshold voltage of one selected field effect transistor of two field effect transistors connected to different storage nodes of the circuit so as to predispose the circuit place the storage nodes in predetermined and opposite states.

17 Claims, 3 Drawing Sheets

US 7,735,046 B2

E-FUSE AND METHOD

This Application is a Continuation-in-Part of copending U.S. patent application Ser. No. 11/735,652, filed on Apr. 16, 2007.

FIELD OF THE INVENTION

The present invention relates to the field of electronic-fuses; more specifically, it relates to an electronic fuse circuit, the method of programming the electronic fuse circuit and a design structure on which the e-fuse circuit resides.

BACKGROUND OF THE INVENTION

Current electronic fuse (e-fuse) circuits require large areas of chip real estate for the fuses themselves as well as the e-fuse program circuits and read fuse state circuits. As post manufacture programmable modes are increasing, the e-fuse area is likely to increase as well. Further, current e-fuse technology is not only area-inefficient, but requires an additional voltage source capable of driving currents that are high enough to "blow" the fuse which adds additional expense. Therefore, there is a need for an area efficient e-fuse that does not require a separate fuse-blow power supply to program the e-fuse.

SUMMARY OF THE INVENTION

A first aspect of the present invention is a method, comprising: (a) providing a circuit comprising: a first field effect transistor having drain connected to a first storage node, a gate connected to a second storage node and a source coupled to a first terminal of a power supply through a second field effect transistor; a third field effect transistor having a drain connected to the second storage node, a gate connected to the first storage node and a source coupled to the first terminal of the power supply through the second field effect transistor; and means for sensing the states of the first and second storage nodes; (b) applying field effect transistor fatiguing conditions to the circuit; (c) placing the second transistor in an on state; (d) either (i) writing a zero to the first storage node and a one to the second storage node while the second field effect transistor is in the on state and maintaining the states of the first and second storage nodes and the until a threshold voltage of the third field effect transistor increases by an amount detectable by the means for sensing or (ii) writing a one to the first storage node and a zero to the second storage node while the second field effect transistor is in the on state and maintaining the states of the first and second storage nodes and the until a threshold voltage of the first field effect transistor increases by increases by an amount detectable by the means for sensing; and (e) after (d), removing the field effect transistor fatiguing conditions from the circuit.

A third aspect of the present invention is a design structure embodied in a machine readable medium for designing, manufacturing, or testing a design, the design structure comprising: a first field effect transistor having drain connected to a first storage node, a gate connected to a second storage node and a source coupled to a first terminal of a power supply through a second field effect transistor; a third field effect transistor having a drain connected to the second storage node, a gate connected to the first storage node and a source coupled to the first terminal of the power supply through the second field effect transistor; and means for sensing the states of the first and second storage nodes

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
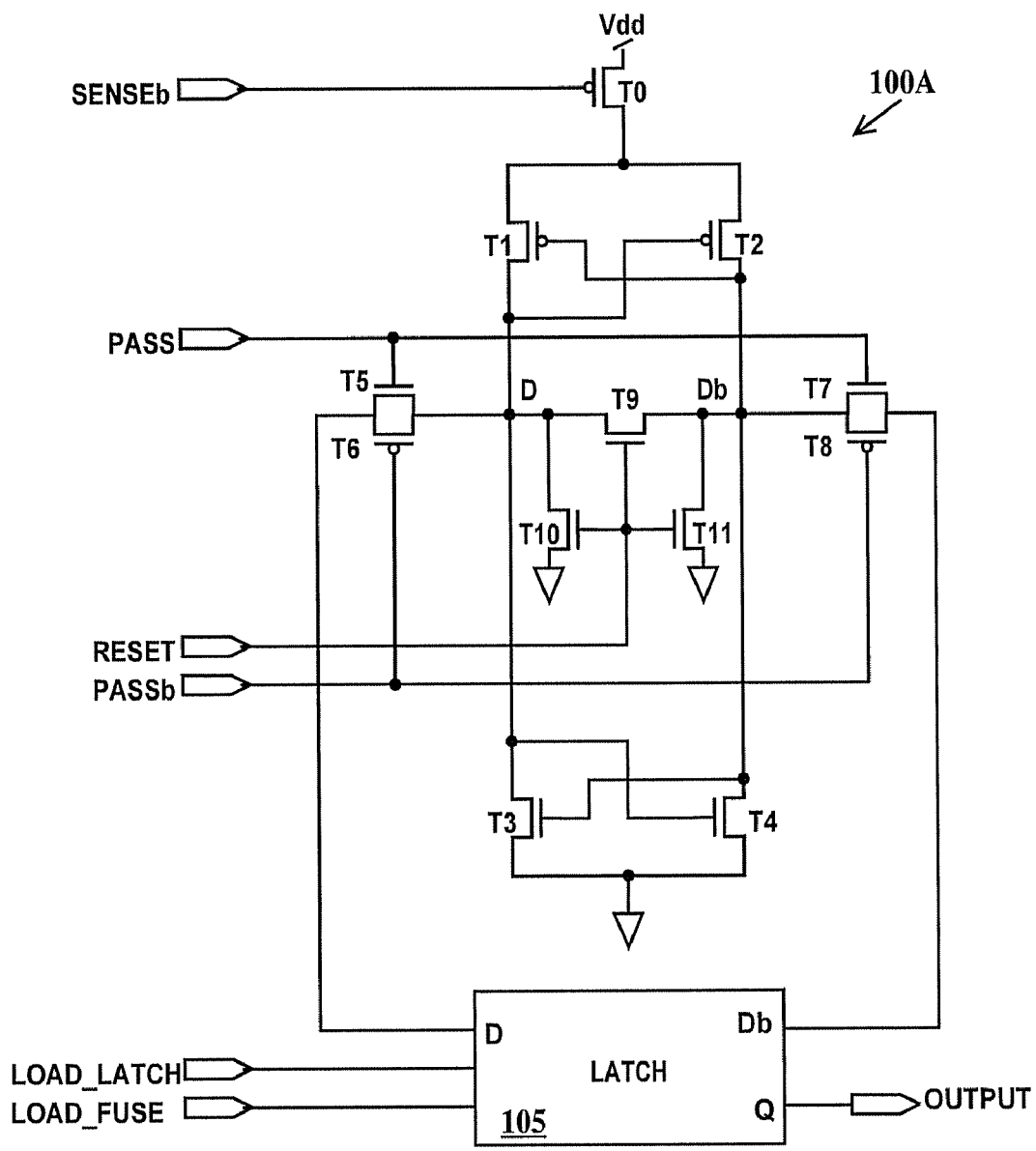
FIG. 1 a circuit diagram of an exemplary first e-fuse circuit utilizing PFETs as the programmable devices according to the present invention.

The threshold voltage (Vt) of p-channel field effect transistors (PFETs) and n-channel field effect transistors (NFETs) can be shifted by applying the predetermined combinations of bias to each of the source, drain and gate terminals of the devices while the device is at (i) an elevated temperature (i.e., a temperature above room temperature), (ii) an elevated voltage (i.e., a voltage greater than the normal operating voltage of the integrated circuit in use) or (iii) at both elevated temperature and voltage. Fatiguing conditions are defined by any of conditions (i), (ii) and (iii). The amount of Vt shift is a function of the actual bias conditions (see Table I infra), the temperature and the duration of time the device is bias at the elevated temperature holding the physical parameters (e.g. device dimensions, materials and material thicknesses) constant.

In one example, a PFET having a |Vt| of about 400 mv, after biasing by applying ground (logical zero or low) to the gate and Vdd (logical 1 or high) to the source and the drain will have a |Vt| of about 450 mv after about 5 hours at about 140° C. and at voltage that is about 1.5 times the design nominal operating voltage of the NFETS and PFETs of circuit 100B. Thus the Vt shift of about 50 mv is introduced and can be detected by suitable circuitry.

In one example, an NFET having a Vt of about 400 mv, after biasing by applying Vdd (logical one) to the gate and ground (logical 0) to the source and the drain will have a Vt of about 410 mv after about 5 hours at about 140° C. and at voltage that is about 1.5 times the design nominal operating voltage of the NFETS and PFETs of circuit 100B. This Vt shift of about 10 mv, though smaller than that for a comparable PFET is about 50 mv is still within a range that is detected by suitable circuitry.

The conditions of 140° C. and 1.5 times the design nominal operating voltage are typical of a type of reliability testing (or screening) called Burn-In. Burn-In testing is designed to stress circuit elements, such as PFETs and NFETs, to cause devices that would otherwise be early field fails under normal operating temperatures and/or voltages to fail during test. Burn-In is performed at elevated temperatures (e.g. about 140° C. or 180° C. for deep Burn-In) and/or at elevated voltages. In order to minimize added fabrication steps, it is advantageous to perform the "programming" of e-fuses according to the present invention simultaneously with Burn-In the event that the Burn-in testing utilizes voltages greater than nominal design operating voltages, those voltages are applied to the Vdd terminal of e-fuse circuits 100A and 100B of FIG. 3 described infra.

Various CMOS processes fatigue the NFET or PFET devices to different magnitudes. The choice of which type of FET device should be used as a programmable devices depends on the magnitude of Vt shift that the device will undergo during BURN-IN in that specific process. The larger the Vt shift the easier the e-fuse is to sense and the smaller the size of it. Vt shifts can also occur at other biasing schemes as show in Table I where 1 represents logical high voltage, 0 represents logical low voltage and X represents either logical high or logical low voltage.

TABLE I

| Vt Shift | PFET | NFET |
| --- | --- | --- |
| "no" or "minimal" | Gate (1) Source (X) Drain (X) | Gate (0) Source (X) Drain (X) |
| Least | Gate (0) Source (0) Drain (0) | Gate (1) Source (1) Drain (1) |
| Medium | Gate (0) Source (1) Drain (0) | Gate (1) Source (1) Drain (0) |
| Medium | Gate (0) Source (0) Drain (1) | Gate (1) Source (0) Drain (1) |
| Most | Gate (0) Source (1) Drain (1) | Gate (1) Source (0) Drain (0) |

FIG. 1 a circuit diagram of an exemplary first e-fuse circuit utilizing PFETs as the programmable devices according to the present invention. In FIG. 1, an e-fuse circuit 100A includes PFETS T0, T1, T2, T6 and T8, NFETs T3, T4, T5, T7, T9, T10 and T11 and a latch 105 which comprise a sense amplifier. PFET T0 is the state sense device. PFETs T1 and T2 are cross-coupled devices that comprise the "fuse" in that either the Vt of PFET T1 or the Vt of PFET T2 will be shifted to "program" the "fuse." NFETs T9, T10, and T11 comprise a reset and equalization devices. NFET T5/PFET T6 and NFET T7/PFET T8 are bit switches. NFETS T3 and T4 are cross-coupled devices that mirror the state of PFETs T1 and T2.

In circuit 100A, the source of PFET T0 is connected to Vdd, the gate to a signal SENSEb and the drain to the sources of PFETs T1 and T2. The gate of PFET T1 is connected to a node Db and the drain of PFET T1 is connected to a node D. The gate of PFET T2 is connected to node D and the drain of PFET T2 is connected to a node Db. The gate of NFET T3 is connected to node Db and the drain of NFET T3 is connected to node D. The gate of NFET T4 is connected to node D and the drain of NFET T4 is connected to node Db. The sources of NFETs T3 and T4 are connected to ground. The source/drains of NFET T9 are connected between nodes D and Db. The drain of NFET T10 is connected to node D and the source NFET T10 is connected to ground. The drain of NFET T11 is connected to node Db and the source NFET T11 is connected to ground. The gates of NFETs T9, T10 and T11 are connected to a signal RESET. The source/drains of NFET T5 are connected between node D and a D input/output of latch 105. The source/drains of NFET T7 are connected between node Db and a Db input/output of latch 105. The source/drains of PFET T6 are connected between node D and the D input/output of latch 105. The source/drains of PFET T8 are connected between node Db and the Db input/output of latch 105. The gates of NFETs T5 and T7 are connected to a signal PASS and the gates of PFETS T6 and T8 are connected to a signal PASSb. PASS and PASSb are complement signals. Latch 105 is responsive to a LOAD-LATCH signal and a LOAD-FUSE signal and has an output Q. PFET T0 may be replaced by an NFET by using a complement signal of the SENSEb signal.

A "0" state of fuse circuit 105A latches a 1 on node Db and a 0 on node D. A "1" state of fuse circuit 105A latches a 0 on node Db and a 1 on node D. To write a "1" (D=1, Db=0) the opposite state (D=0 and Db=1) is applied during the programming which will shift the |Vt| of PFET T2 higher (e.g. after programming, the |Vt| of PFET T2 is 450 mv while the |Vt| of PFET T1 is 400 mv.) With PFET T2, weaker during the sense-phase, the PFET T2 will not be able to pull-up node Db as fast as the stronger PFET T1 which is pulling up node D, causing the sense to always evaluate with the node D as high. To write a "0" (D=0, Db=1) the opposite state (D=1 and Db=0) is applied during the programming, which will shift the |Vt| of PFET T1 higher (e.g. after programming, the |Vt| of PFET T1 is 450 mv while the |Vt| of PFET T2 is 400 mv.) With PFET T1 weaker during the sense-phase, the PFET T1 will not be able to pull-up node D as fast as PFET T2 which is pulling up node Db, causing the sense to always evaluate with the node D as low.

The signal sequence to program (or write) the "fuse" is: (1) elevate the temperature of circuit 100A and/or voltage (e.g. temperature to about 140° C. in an oven, and voltage to 1.5V in a 1V nominal process), (2) set LOAD_LATCH=0 and LOAD_FUSE=1, (3) Apply write data from latch 105 to the bit switches (T5/T6) and (T7/T8), (3) set PASS=1, PASSb=0 and RESET=0 to propagate the write data from the latch to the data nodes (D, Db) of the e-fuse circuit, (4) set SENSEb=0 to latch the written data, and (5) apply conditions for fixed length of time (e.g. 5 hours).

The signal sequence sense to read the fuse state (or read) is: (1) decouple nodes D and Db from latch 105 by setting PASS=0 and PASSb=1, (2) reset both data nodes D and Db to zero with RESET set to 1, (3) transition RESET from 1 to 0, (4) pulse SENSEb to 0 while PASS=0, RESET=0 and PASSb=1, (5) set LOAD_LATCH=1 and LOAD_FUSE=0, and (6) turn on the pass gates to apply e-fuse read data to the latch with PASS=1, RESET=0 and PASSb=0.

After a read, the circuit may be returned to the state used to write the fuse, SENSEb=0, PASS=1, RESET=0, PASSb=0, LOAD_LATCH=0 and LOAD_FUSE=1 with D=0 and Db=1 for "1" fuse state or with D=1 and Db=0 for a "0: fuse state. This state should further reinforce the written state in case the fuse has to be read multiple-times.

Figure 2:
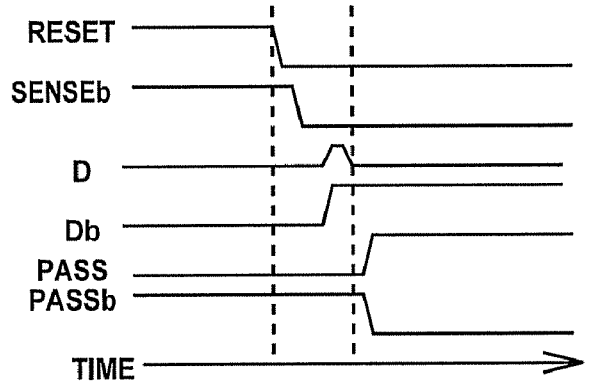
FIG. 2 is a timing diagram illustrating certain signals during a read of an e-fuse circuit according to the present invention.

FIG. 2 is a timing diagram illustrating certain signals during a read of an e-fuse circuit according to the present invention. In FIG. 2, the sensing of a "0" fuse state is illustrated. The control signals have been described supra. As can be see in FIG. 2, node Db goes high and stays high, but D, attempts to go high, but is pulled low. The opposite will occur if the "fuse" is in the "1" state, D would go and stay high, but Db would attempt to go high, but would be pulled low.

Figure 3:
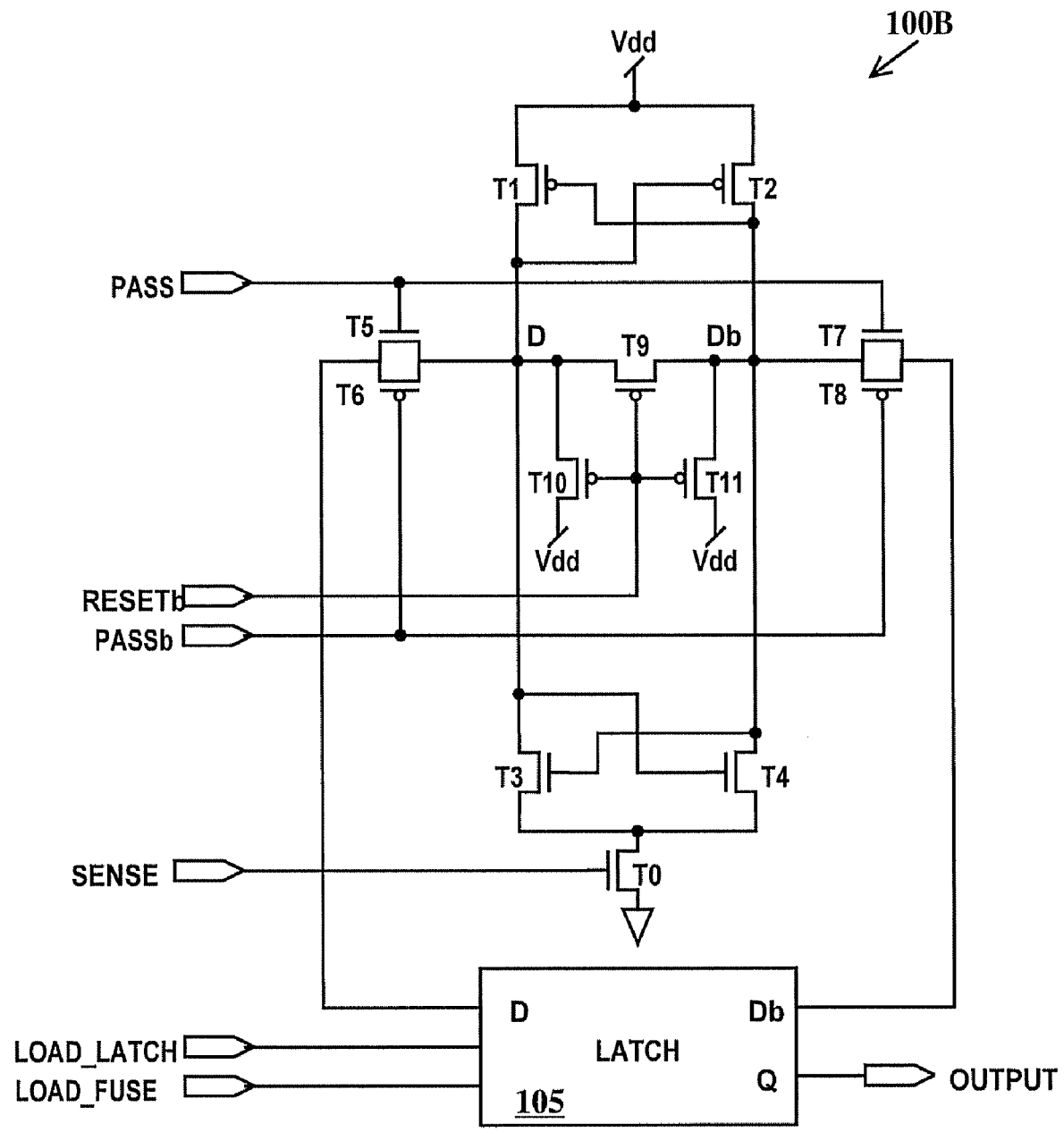
FIG. 3 is a circuit diagram of an exemplary second e-fuse circuit utilizing NFETs as the programmable devices according to the present invention.

FIG. 3 is a circuit diagram of an exemplary second e-fuse circuit utilizing NFETs as the programmable devices according to the present invention. In FIG. 3, an e-fuse circuit 110B is similar to e-fuse circuit 100A of FIG. 1, except transistor (i) T0 is an NFET instead of a PFET, (ii) transistors T9, T10 and T11 are PFETs instead of NFETs, (iii) transistor T0 is connected between the sources of NFETs T3 and T4 and ground instead of between the sources of PFETs T1 and T2 and Vdd, (iv) the sources of transistors T10 and T11 are connected to Vdd instead of ground. (v) NFETs T3 and T4 comprise the programmable elements instead of PFETs T1 and T2, (vi) the gates of transistors T9, T10 and T11 are connected to RESETb (the complement of RESET), and (vii) the gate of transistor T0 is connected to SENSE, (the complement of SENSEb)

In order to increase the reliability of the e-fuse circuits sensing the correct state, the measurable induced shift in Vt should greater than the across chip variation (ACV) for otherwise identical un-fatigued FETs. This may be accomplished by increasing the channel width and length of the FET to be fatigued (FETs T1 and T2) compared to the other FETs in the circuits of FIGS. 1 and 3. In one case, a device that had a 50 mv Vt ACV can be reduced to a 25 mv Vt ACV by increasing the channel area by a factor of four. This still results in an e-fuse circuit that is about 80% smaller than conventional e-fuse circuits that require an actual fusible link.

Figure 4:
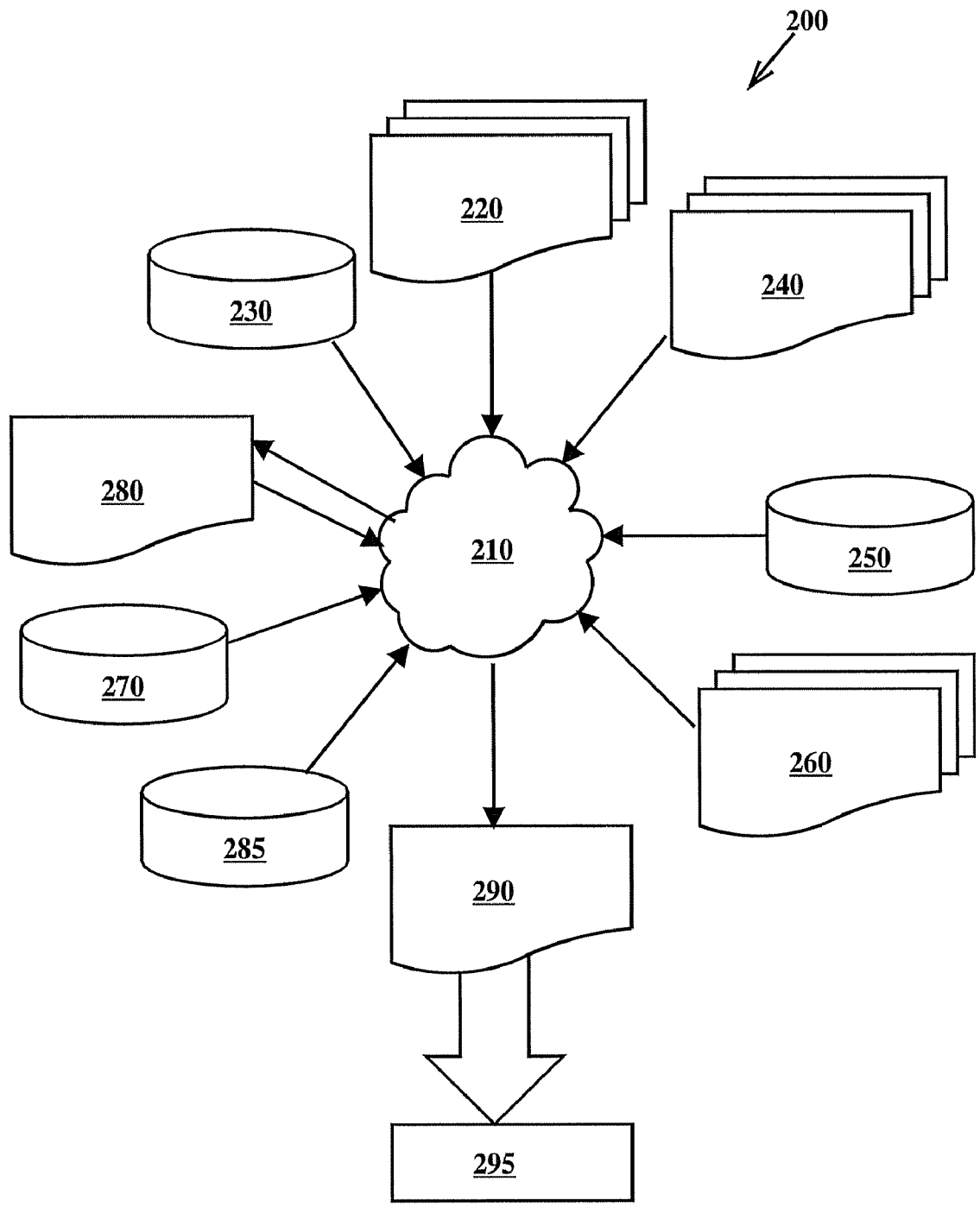
FIG. 4 is a flow diagram of a design process used in semiconductor design, manufacturing, and/or test.

FIG. 4 shows a block diagram of an example design flow 200. Design flow 200 may vary depending on the type of IC being designed. For example, a design flow 200 for building an application specific IC (ASIC) may differ from a design flow 200 for designing a standard component. Design structure 220 is preferably an input to a design process 210 and may come from an IP provider, a core developer, or other design company or may be generated by the operator of the design flow, or from other sources. Design structure 220 comprises circuit 100A of FIG. 1 or circuit 110B of FIG. 3 in the form of schematics or HDL, a hardware-description language (e.g., Verilog, VHDL, C, etc.). Design structure 220 may be contained on one or more machine readable medium. For example, design structure 220 may be a text file or a graphical representation of circuit 100. Design process 210 preferably synthesizes (or translates) circuit 100 into a netlist 280, where netlist 280 is, for example, a list of wires, transistors, logic gates, control circuits, I/O, models, etc. that describes the connections to other elements and circuits in an integrated circuit design and recorded on at least one of machine readable medium. This may be an iterative process in which netlist 280 is resynthesized one or more times depending on design specifications and parameters for the circuit. Design process 210 may include using a variety of inputs; for example, inputs from library elements 230 which may house a set of commonly used elements, circuits, and devices, including models, layouts, and symbolic representations, for a given manufacturing technology (e.g., different technology nodes, 32 nm, 45 nm, 20 nm, etc.), design specifications 240, characterization data 250, verification data 260, design rules 270, and test data files 285 (which may include test patterns and other testing information). Design process 210 may further include, for example, standard circuit design processes such as timing analysis, verification, design rule checking, place and route operations, etc. One of ordinary skill in the art of integrated circuit design can appreciate the extent of possible electronic design automation tools and applications used in design process 210 without deviating from the scope and spirit of the invention. The design structure of the invention is not limited to any specific design flow.

Ultimately, design process 210 preferably translates circuit 100, along with the rest of the integrated circuit design (if applicable), into a final design structure 220 (e.g., information stored in a GDS storage medium). Final design structure 220 may comprise information such as, for example, test data files, design content files, manufacturing data, layout parameters, wires, levels of metal, vias, shapes, test data, data for routing through the manufacturing line, and any other data required by a semiconductor manufacturer to produce circuit 100. Final design structure 220 may then proceed to a stage 225 where, for example, final design structure 220: proceeds to tape-out, is released to manufacturing, is sent to another design house or is sent back to the customer.

Thus, the present invention provides an area efficient e-fuse that does not require a separate fuse-blow power supply to program the e-fuse.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A design structure embodied in a machine readable medium for designing, manufacturing, or testing a design, the design structure comprising:
   a first field effect transistor having drain connected to a first storage node, a gate connected to a second storage node and a source connected to a first source/drain of a second field effect transistor, a second source/drain of said second field effect transistor connected to a first power supply line;
   a third field effect transistor having a drain connected to said second storage node, a gate connected to said first storage node and a source connected to said first source/drain of said second transistor; and
   means for sensing the states of said first and second storage nodes.

2. The design structure of claim 1, wherein said first and third field effect transistors are p-channel field effect transistors.

3. The design structure of claim 2, wherein said first power supply line is a high voltage line or Vdd line.

4. The design structure of claim 1, wherein said first and third field effect transistors are n-channel field effect transistors.

5. The design structure of claim 4, wherein said first power supply line is a low voltage or ground line.

6. The design structure of claim 1, including:
   a fourth field effect transistor having drain connected to said first storage node, a gate connected to said second storage node and a source connected to a second power supply line;
   a fifth field effect transistor having a drain connected to said second storage node, a gate connected to said first storage node and a source connected to said second power supply line; and
   wherein said first and third field effect transistors are of a first channel type and said fourth and fifth field effect transistor are of a second channel type different from said first type.

7. The design structure of claim 6, further including:
   a sixth field effect transistor having a first source/drain connected to first storage node, a second source/drain connected to said second storage node and a gate connected to a reset pin of said circuit;
   a seventh field effect transistor having a drain connected to said first storage node, a source connected to said second terminal of said power supply and a gate connected to said reset pin; and
   an eighth field effect transistor having a drain connected to said second storage node, a source connected to said second terminal of said power supply and a gate connected to said reset pin.

8. The design structure of claim 7, wherein said fourth, fifth and sixth field effect transistors are of said second channel type.

9. The design structure of claim 7, further including:
   a ninth field effect transistor having a first source/drain connected to said first storage node, a gate connected to a first pass pin of said circuit and a second source/drain connected to a first data pin of a latch; and a tenth field effect transistor having a first source/drain connected to said second storage node, a gate connected to said first pass pin of said circuit and a second source/drain connected to said second data pin of said latch.

10. The design structure of claim 9, wherein said ninth and tenth field effect transistors are of said second channel type.

11. The design structure of claim 9, further including:
an eleventh field effect transistor having a first source/drain connected to said first storage node, a gate connected to a second pass pin of said circuit and a second source/drain connected to said first data pin of said latch; and
a twelfth field effect transistor having a first source/drain connected to said second storage node, a gate connected to said second pass pin of said circuit and a second source connected to said second data pin of said latch.

12. The design structure of claim 11, wherein said eleventh and twelfth field effect transistors are of said first channel type.

13. The design structure of claim 1, including:
a latch having a first input/output coupled to said first storage node through a first bit switch and a second input/output coupled to said second storage node through a second bit switch, said first and second bit switches each comprising a p-channel field effect transistor and a n n-channel field effect transistor.

14. The design structure of claim 1, wherein the design structure comprises a netlist.

15. The design structure of claim 1, wherein the design structure resides on a GDS storage medium.

16. The design structure of claim 1, wherein the design structure includes at least one of test data files, characterization data, verification data, or design specifications.

17. The design structure of claim 1, wherein a gate of said second field effect transistor is connected to a sense pin.

* * * * *